US008390345B2

(12) United States Patent
Kim et al.

(10) Patent No.: US 8,390,345 B2
(45) Date of Patent: Mar. 5, 2013

(54) APPARATUS AND METHOD FOR GENERATING RAMP WAVEFORM

(75) Inventors: Sung Nam Kim, Seoul (KR); Cha Kwang Kim, Seoul (KR); Young Sik Lee, Seoul (KR)

(73) Assignee: Fairchild Korea Semiconductor Ltd., Bucheon (KR)

( * ) Notice: Subject to any disclaimer, the term of this patent is extended or adjusted under 35 U.S.C. 154(b) by 97 days.

(21) Appl. No.: 13/049,149

(22) Filed: Mar. 16, 2011

(65) Prior Publication Data

US 2011/0291709 A1 Dec. 1, 2011

(30) Foreign Application Priority Data

May 27, 2010 (KR) ........................ 10-2010-0049711

(51) Int. Cl.
*H03K 4/06* (2006.01)

(52) U.S. Cl. ......................... 327/134; 327/108; 327/419

(58) Field of Classification Search .................. 327/108, 327/109, 111, 112, 134, 419, 427, 434
See application file for complete search history.

(56) References Cited

U.S. PATENT DOCUMENTS

| | | | | |
|---|---|---|---|---|
| 4,225,825 A * | 9/1980 | Watts | ......... | 327/134 |
| 5,469,094 A * | 11/1995 | Nessi | ......... | 327/110 |
| 5,742,193 A * | 4/1998 | Colli et al. | ......... | 327/170 |
| 5,828,245 A * | 10/1998 | Brambilla et al. | ......... | 327/108 |
| 6,853,149 B2 * | 2/2005 | Roh et al. | ......... | 315/169.4 |
| 8,008,953 B1 * | 8/2011 | Brumett et al. | ......... | 327/109 |
| 8,283,953 B2 * | 10/2012 | Brumett et al. | ......... | 327/109 |
| 2008/0054984 A1 * | 3/2008 | Lee | ......... | 327/419 |
| 2009/0174442 A1 * | 7/2009 | Kim et al. | ......... | 327/134 |
| 2012/0200547 A1 * | 8/2012 | Lee | ......... | 345/208 |

FOREIGN PATENT DOCUMENTS

| | | |
|---|---|---|
| KR | 10-2003-0078520 | 10/2003 |
| WO | WO 2009045049 A1 * | 4/2009 |

* cited by examiner

*Primary Examiner* — Lincoln Donovan
*Assistant Examiner* — William Hernandez
(74) *Attorney, Agent, or Firm* — Okamoto & Benedicto LLP

(57) ABSTRACT

A ramp waveform generating apparatus generates a reference waveform by using an input signal and generates a driving control signal for turning on and off a switch having a first terminal connected to a load and a second terminal connected to a power supply by comparing the voltage of the reference waveform with the voltage of the load. While the switch is repetitively turned on and off in accordance with the driving control signal, a ramp waveform may be generated.

24 Claims, 17 Drawing Sheets

APPARATUS AND METHOD FOR GENERATING RAMP WAVEFORM

CROSS-REFERENCE TO RELATED APPLICATION

This application claims priority to and the benefit of Korean Patent Application No. 10-2010-0049711 filed in the Korean Intellectual Property Office on May 27, 2010, the entire contents of which are incorporated herein by reference.

BACKGROUND OF THE INVENTION (a) Field of the Invention

The present invention relates to an apparatus and a method for generating a ramp waveform.

(b) Description of the Related Art

A plasma display device uses a plasma display panel that displays texts or images by using plasma generated by gas discharge.

In the plasma display device, a rising ramp waveform of gradually increasing the voltage of an electrode and a falling ramp waveform of gradually decreasing the voltage of the electrode during a reset period so as to form uniform wall charges for all cells while inducing the generation of continuous dark discharge are applied to the electrode. The slope of the ramp waveform serves as an important factor to determine the image quality of a plasma display panel.

In the related art, during a manufacturing process, a variable resistor connected between a gate of a transistor and a gate driver of the transistor is manually adjusted to control the slope of the ramp waveform. However, such a method may complexify the manufacturing process and may increase an adjustment deviation and much additional process cost resulting from a manual work. Further, the slope of the ramp waveform is influenced by a variation of a power semiconductor switch, a variation of reference voltage, and temperature characteristics. However, only by using the method of manually adjusting the variable resistor during the manufacturing process, it is impossible to accurately adjust the slope of the ramp waveform which varies by an internal factor or an external factor.

As a technology to solve the problem, a technology of detecting image information relating to the slope of the ramp waveform and thereafter, automatically generating the slope of the ramp waveform on the basis of the detected image information has been proposed. However, the technology has a feedback algorithm for detecting the image information relating to the slope of the ramp waveform, which is significantly complicated and requires many elements such as an analog-to-digital converter (ACD) or a digital-to-analog converter (DAC), a comparator, a photocoupler, and the like.

Another related art which controls the slope of the ramp waveform controls the slope of the ramp waveform by detecting voltage applied to the transistor and providing a feedback gain for controlling the gate of the transistor in an error amplifier depending on the voltage applied to the transistor. However, although such a method may generate a stable ramp waveform regardless of internal and external factors, but it requires a bootstrap capacitor having high capacitance in order to detect the voltage applied to the transistor and cannot change the slope of the ramp waveform.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide an apparatus and a method for generating a ramp waveform capable of stably driving a plasma display panel by more accurately the slope of the ramp waveform even by an internal factor or an external factor.

Further, the present invention has been made in an effort to provide an apparatus and a method for generating a ramp waveform capable of changing the slope of the ramp waveform in accordance with a condition of the plasma display panel.

An exemplary embodiment of the present invention provides an apparatus for generating a ramp waveform, which controls a switch having a first terminal connected to a load and a second terminal connected to a power supply. The ramp waveform generating apparatus includes a gate driver and a ramp slope compensation circuit. The gate driver is connected to a control terminal of the switch and changes the voltage of the load to a ramp form by outputting a driving control signal for controlling on and off operations of the switch to the control terminal of the switch. In addition, a ramp slope compensation circuit receives an input signal having a predetermined duty, senses a voltage of the load, and controls the driving control signal by using the voltage of the load and the input signal.

Another exemplary embodiment of the present invention provides a method for generating a ramp waveform by controlling a switch having a first terminal connected to a load and a second terminal connected to a power supply in a ramp waveform generating apparatus. The ramp waveform generating method includes: receiving an input signal having a predetermine duty; sensing a voltage of the load; generating a reference waveform by using the input signal; generating a driving control signal by comparing the voltage of the load with a voltage of the reference waveform; and generating the lamp waveform by turning on and off the switch in accordance with the driving control signal.

DETAILED DESCRIPTION OF THE EMBODIMENTS

Figure 1:
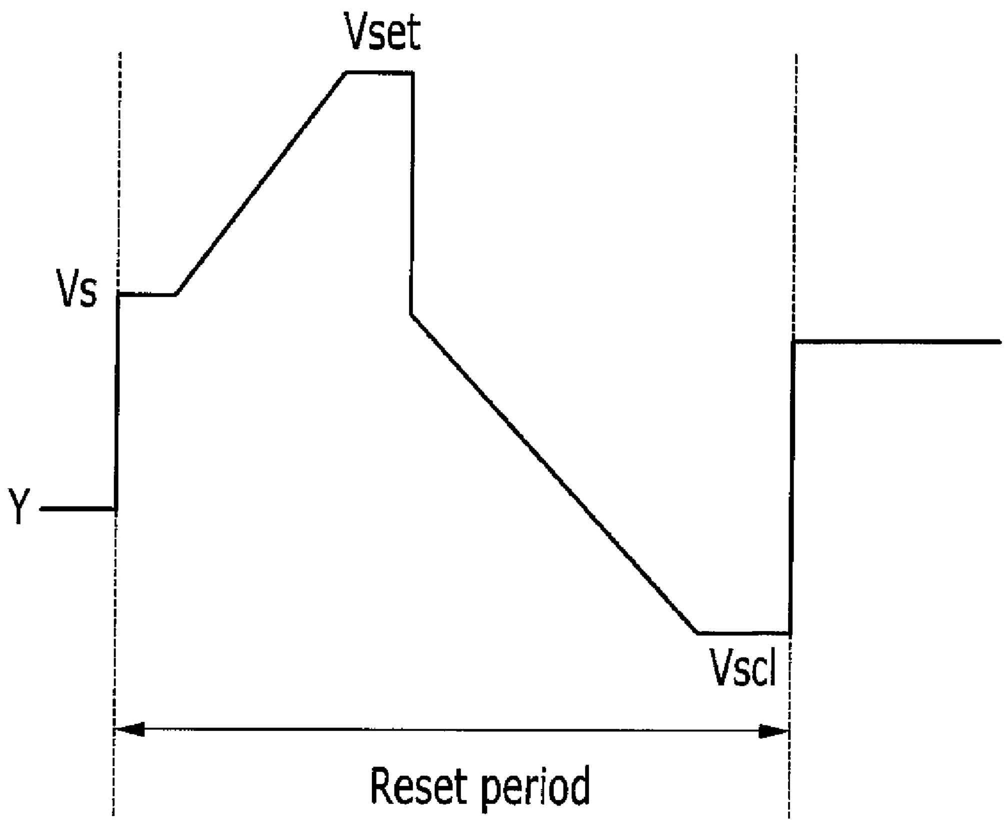
FIG. 1 is a diagram illustrating a driving waveform of a plasma display device adopting the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention. Further, the drawings and description are to be regarded as illustrative in nature and not restrictive. Like reference numerals designate like elements throughout the specification.

In the specification and the appended claims, unless explicitly described to the contrary, the word "comprise" and variations such as "comprises" or "comprising", will be understood to imply the inclusion of stated elements but not the exclusion of any other elements. Further, a case in which any one part is connected with the other part includes a case in which the parts are directly connected with each other and a case in which the parts are connected with each other with other elements interposed therebetween.

Hereinafter, an apparatus and a method for generating a ramp waveform according to an exemplary embodiment of the present invention will be described in detail with reference to the accompanying drawings.

FIG. 1 is a diagram illustrating a driving waveform of a plasma display device adopting the present invention. In FIG. 1, for better comprehension and ease of description, an electrode applied with a ramp waveform is shown as a Y electrode and only the driving waveform applied to the Y electrode is shown during a reset period, in the plasma display device.

Referring to FIG. 1, a rising ramp waveform in which the voltage of the Y electrode gradually increases from voltage Vs to voltage Vset during a rising period of the reset period is applied to the Y electrode and a falling ramp waveform in which the voltage of the Y electrode gradually decreases from voltage Vs to voltage Vscl during a falling period of the reset period is applied to the Y electrode. While dark discharge is generated in all cells by the rising ramp waveform and the falling ramp waveform, uniform wall charges may be formed.

Figure 2:
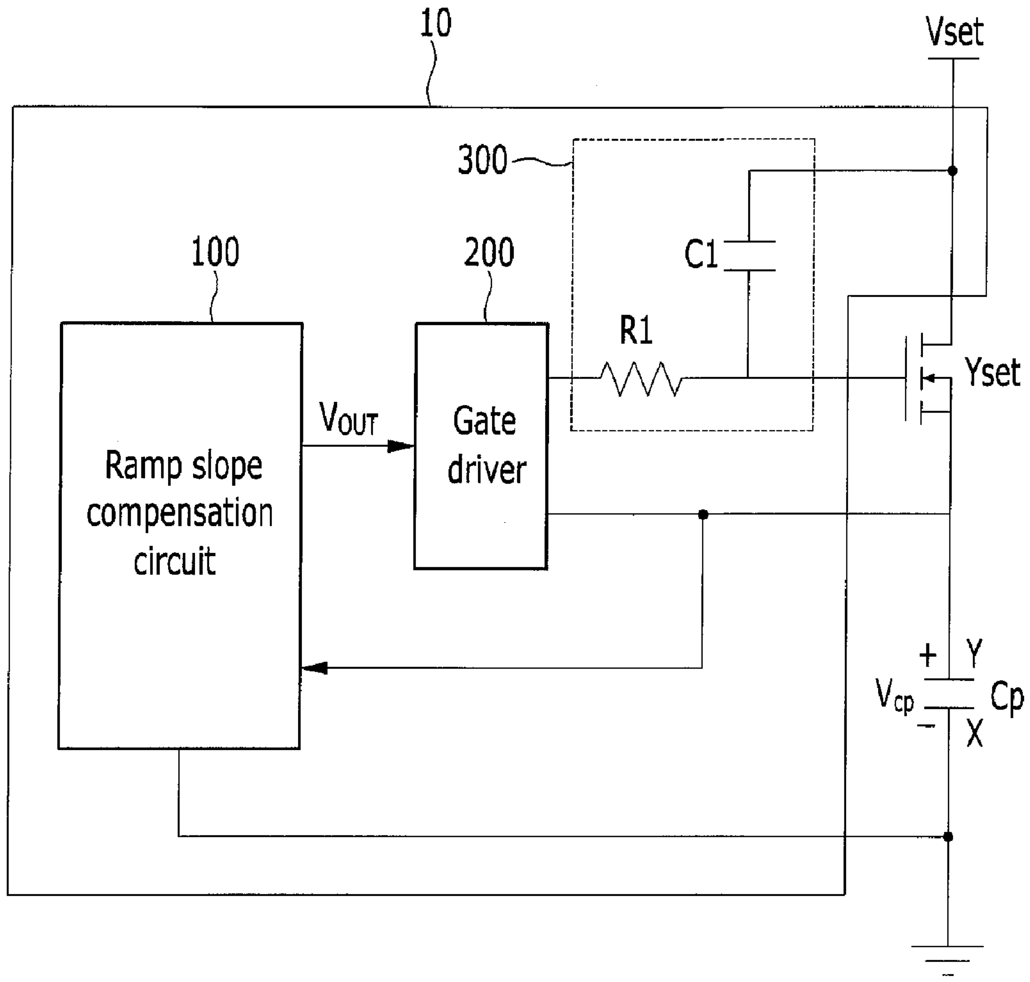
FIG. 2 is a diagram illustrating a driver of a plasma display device adopting the present invention.

FIG. 2 is a diagram illustrating a driver of the plasma display device adopting the present invention. In FIG. 2, for better comprehension and ease of description, only the driver for applying the rising ramp waveform is shown, but a capacitive element which is formed by one Y electrode and one X electrode (alternately, A electrode) is shown as the panel capacitor Cp and the X electrode is grounded.

Referring to FIG. 2, the driver of the plasma display device includes a transistor Yset and a ramp waveform generator 10. Further, the ramp waveform generator 10 includes a ramp slope compensation circuit 100, a gate driver 200, and a ramp auxiliary circuit 300. In this case, the transistor Yset is shown as an n-channel field effect transistor, particularly, an n-channel metal oxide semiconductor (NMOS) transistor, but another transistor having a similar function may be used as the transistor Yset.

A source of the transistor Yset is connected to a Y electrode of a panel capacitor Cp and a drain of the transistor Yset is connected to a power supply Vset supplying voltage Vset.

The ramp slope compensation circuit 100 senses the voltage $V_{CP}$ of a load, i.e., the Y electrode of the panel capacitor Cp, and generates a driving control signal $V_{OUT}$ in accordance with the voltage $V_{CP}$ of the Y electrode of the panel capacitor Cp and outputs it to the gate driver 200.

The gate driver 200 is connected to a gate of the transistor Yset. The gate driver 200 outputs the driving control signal $V_{OUT}$ outputted from the ramp slope compensation circuit 100 to the gate of the transistor Yset to turn on/off the transistor Yset.

The ramp auxiliary circuit 300 is connected between the gate of the transistor Yset and the drain of the transistor Yset and is driven together with the gate driver 200 to increase the voltage of the Y electrode in a ramp form. The ramp auxiliary circuit 300 may include a capacitor C1 that is connected between the drain of the transistor Yset and the gate of the transistor Yset and a resistor R1 that is connected between the gate of the transistor Yset and the gate driver 200.

Specifically, when the driving control signal $V_{OUT}$ of a high level is outputted from the gate driver 200, the gate voltage of the transistor Yset gradually increases by a path formed by a capacitance component formed by the capacitor C1 and a parasitic capacitor of the transistor Yset, and the resistor R1. Therefore, the transistor Yset is turned on while the gate voltage gradually increases, such that current is supplied from the power supply Vset to the Y electrode to increase the voltage of the Y electrode, as a result, the source voltage of the transistor Yset increases. In this case, since the gate voltage of the transistor Yset is sustained by the capacitor C1, when the gate-source voltage of the transistor Yset decreases to be lower than the threshold voltage of the transistor Yset, the transistor Yset is turned off. Thereafter, the gate voltage of the transistor Yset gradually increases by the driving control signal $V_{OUT}$ of the high level supplied from the gate driver 200 to turn on the transistor Yset again, thereby increasing the voltage of the Y electrode again. As such, the voltage of the Y electrode may increase in the ramp form by repetitively turning on and off the transistor Yset.

As described above, the ramp waveform generator 10 according to the exemplary embodiment of the present invention generates the driving control signal for turning on and off the transistor Yset in accordance with the voltage $V_{CP}$ of the Y electrode of the panel capacitor Cp to generate a stable ramp waveform regardless of internal and external factors.

Next, an exemplary embodiment in which the driving control signal $V_{OUT}$ is generated in accordance with the voltage $V_{CP}$ of the Y electrode of the panel capacitor Cp will be described in detail with reference to FIGS. 3 to 11.

Figure 3:
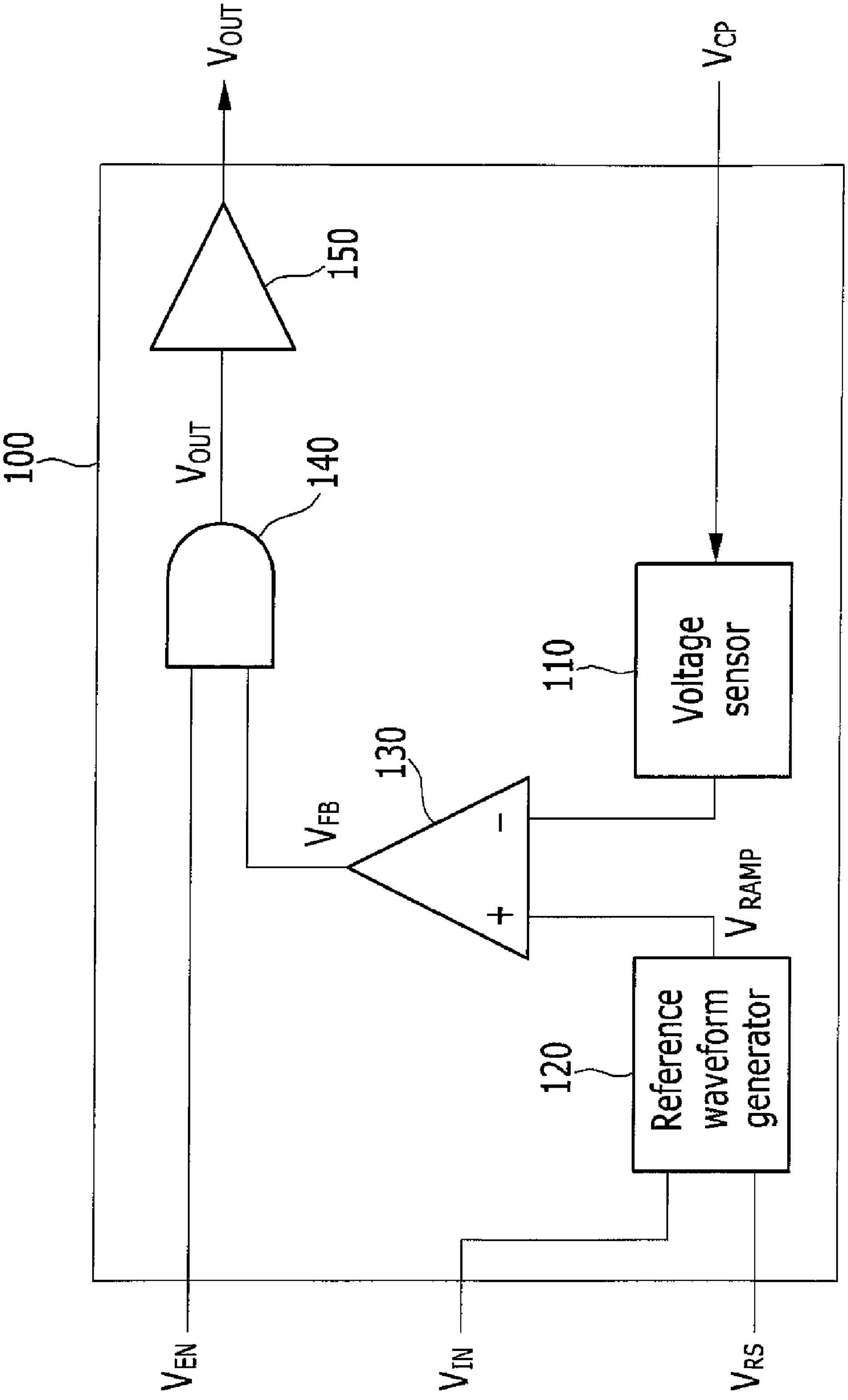
FIG. 3 is a diagram illustrating a ramp slope compensation circuit according to a first exemplary embodiment of the present invention.
Figure 4:
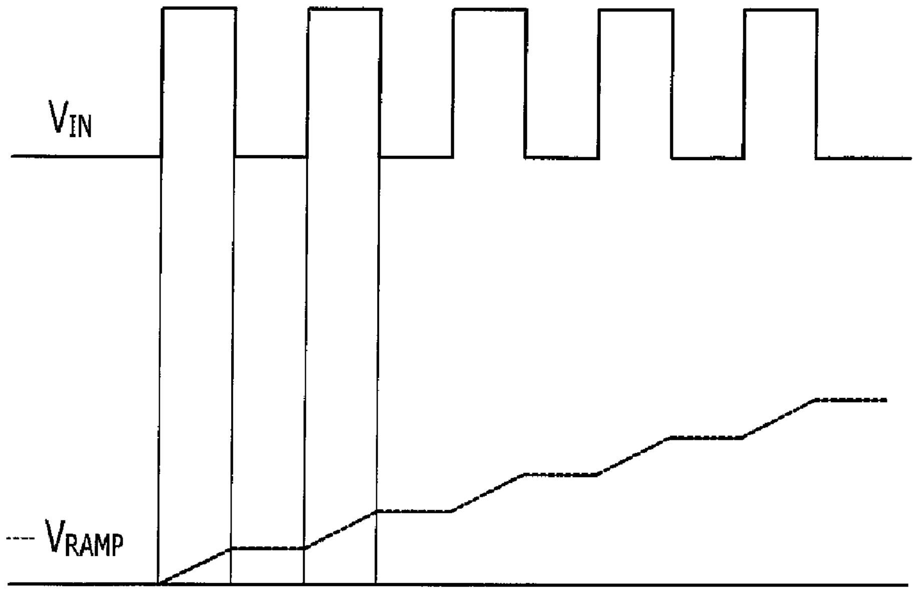
FIG. 4 is a diagram illustrating one example of generating a reference waveform.

FIG. 3 is a diagram illustrating a ramp slope compensation circuit according to a first exemplary embodiment of the present invention and FIG. 4 is a diagram illustrating one example of generating a reference waveform. Referring to FIG. 3, the ramp slope compensation circuit 100 includes a voltage sensor 110, a reference waveform generator 120, a comparator 130, an AND element 140, and a buffer 150.

The voltage sensor 110 senses the voltage $V_{CP}$ of the Y electrode of the panel capacitor Cp and outputs the voltage $V_{CP}$ of the Y electrode to an inversion terminal (−) of the comparator 130.

When the reference waveform generator 120 receives a reference waveform set signal $V_{RS}$, it generates a reference waveform $V_{RAMP}$ by using an input signal $V_{IN}$ and outputs the generated reference waveform $V_{RAMP}$ to an non-inversion terminal (+) of the comparator 130. In this case, the reference waveform generator 120 may generate a linear or stepped ramp waveform as the reference waveform $V_{RAMP}$. As one example, as shown in FIG. 4, the reference waveform generator 120 may generate the reference waveform $V_{RAMP}$ in a pattern in which voltage gradually increases while the input signal $V_{IN}$ is in a high level and the voltage is sustained while the input signal $V_{IN}$ is a low level.

The comparator 130 compares the voltage of the reference waveform $V_{RAMP}$ inputted into the non-inversion terminal (+) with the voltage $V_{CP}$ of the Y electrode inputted into the inversion terminal (−) and outputs a pulse signal $V_{FB}$ resulting from the comparison result to the buffer 150.

The AND element 140 receives an enable signal $V_{EN}$ for operating the ramp slope compensation circuit 100 and the pulse signal $V_{FB}$ of the comparator 130 and AND-computes two signals $V_{FB}$ and $V_{EN}$ which are received to generate the driving control signal $V_{OUT}$. Thereafter, the AND element 140 outputs the driving control signal $V_{OUT}$ to the buffer 150.

The buffer 150 amplifies the driving control signal $V_{OUT}$ outputted from the AND element 140 and thereafter, outputs it to the gate driver 200.

The operation of the ramp slope compensation circuit 100 will be described in detail with reference to FIG. 5.

Figure 5:
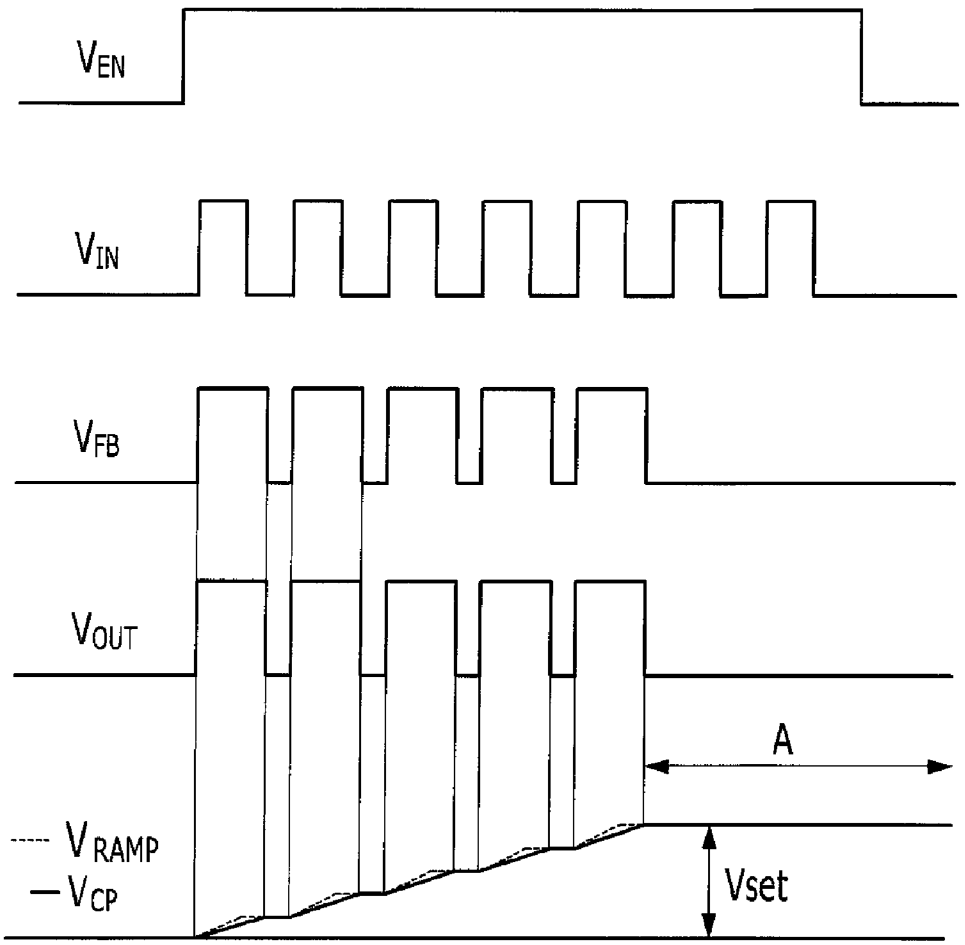
FIG. 5 is an operation timing diagram of the ramp slope compensation circuit according to the first exemplary embodiment of the present invention.

FIG. 5 is an operation timing diagram of the ramp slope compensation circuit according to the first exemplary embodiment of the present invention.

Referring to FIG. 5, the comparator 130 compares the voltage $V_{CP}$ of the Y electrode inputted into the inversion terminal (−) with the voltage of the reference waveform $V_{RAMP}$ inputted into the non-inversion terminal (+). In this case, the comparator 130 outputs the pulse signal $V_{FB}$ of a high level to the AND element 140 when the voltage of the reference waveform $V_{RAMP}$ inputted into the non-inversion terminal (+) is higher than the voltage $V_{CP}$ of the Y electrode inputted into the inversion terminal (−) and outputs the pulse signal $V_{FB}$ of a low level to the AND element 140 when the voltage of the reference waveform $V_{RAMP}$ inputted into the non-inversion terminal (+) is equal to or lower than the voltage $V_{CP}$ of the Y electrode inputted into the inversion terminal (−).

The AND element 140 AND-computes the enable signal $V_{EN}$ and the pulse signal $V_{FB}$ of the comparator 130 to generate the driving control signal $V_{OUT}$. In this case, since the AND element 140 outputs the high level during only a period when both the enable signal $V_{EN}$ and the pulse signal $V_{FB}$ are in the high level, the driving control signal $V_{OUT}$ has the high level when both the enable signal $V_{EN}$ and the pulse signal $V_{FB}$ are in the high level and the low level during the rest of the period.

As such, the driving control signal $V_{OUT}$ according to the exemplary embodiment of the present invention may be determined by the pulse signal $V_{FB}$ resulting from the comparison of the voltage of the reference waveform $V_{RAMP}$ generated by the input signal $V_{IN}$ and the voltage of $V_{CP}$ of the Y electrode.

That is, the ramp slope compensation circuit 100 according to the exemplary embodiment outputs the driving control signal $V_{OUT}$ of the high level until the voltage $V_{CP}$ of the Y electrode reaches the voltage of the reference waveform $V_{RAMP}$. As a result, the voltage $V_{CP}$ of the Y electrode may rapidly follow up the reference waveform $V_{RAMP}$.

Meanwhile, like a period A of FIG. 5, when the voltage $V_{CP}$ of the Y electrode of the panel capacitor Cp is equal to the voltage of the reference waveform $V_{RAMP}$, the pulse signal $V_{FB}$ of the low level may continuously be outputted. Therefore, during the period when the pulse signal $V_{FB}$ has the low level, the driving control signal $V_{OUT}$ also continuously has the low level. As such, in the case in which the period when the driving control signal $V_{OUT}$ has the low level or the high level extends, frequency interference which is caused by a flexible frequency may occur.

Figure 6:
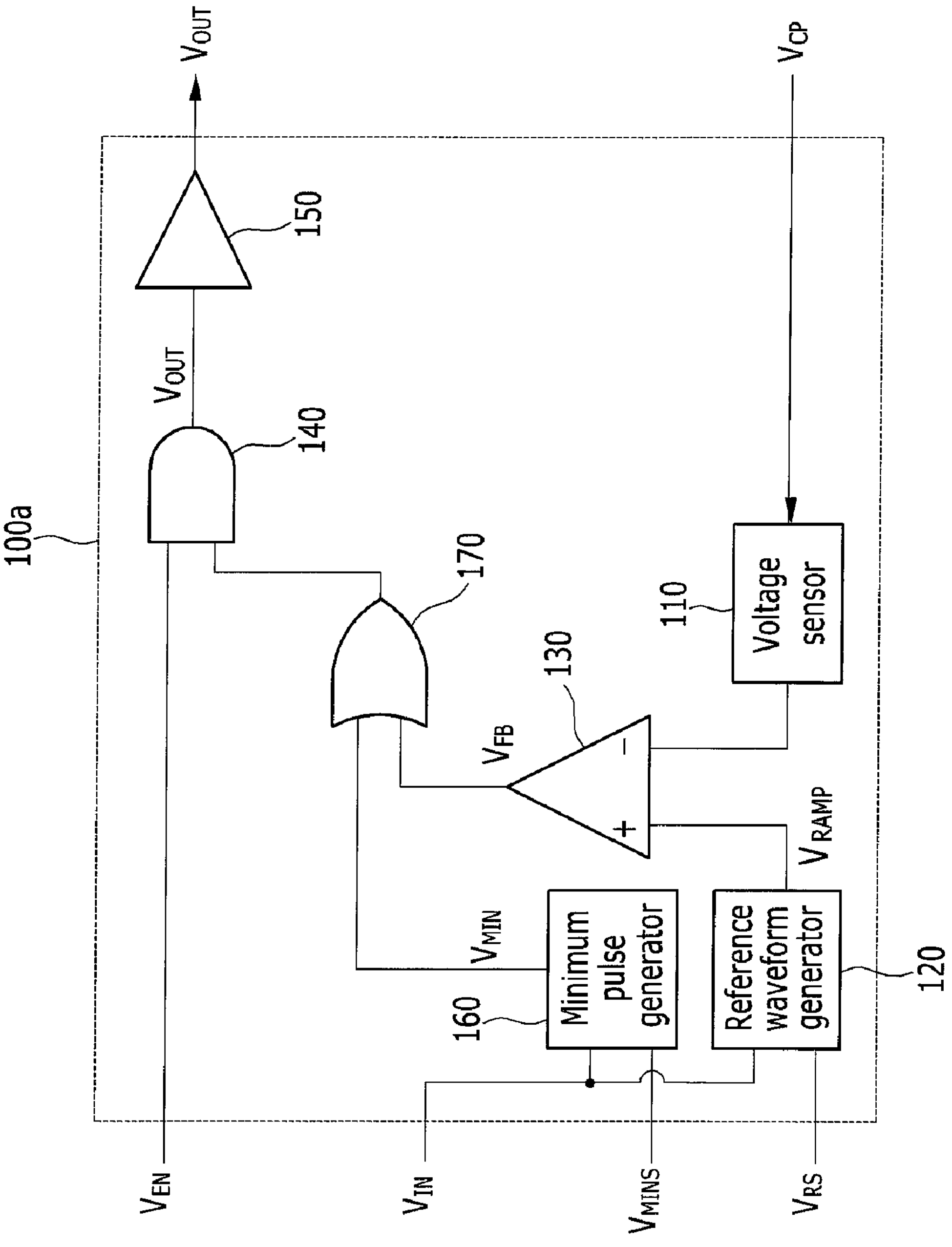
FIG. 6 is a diagram illustrating a ramp slope compensation circuit according to a second exemplary embodiment of the present invention.
Figure 7:
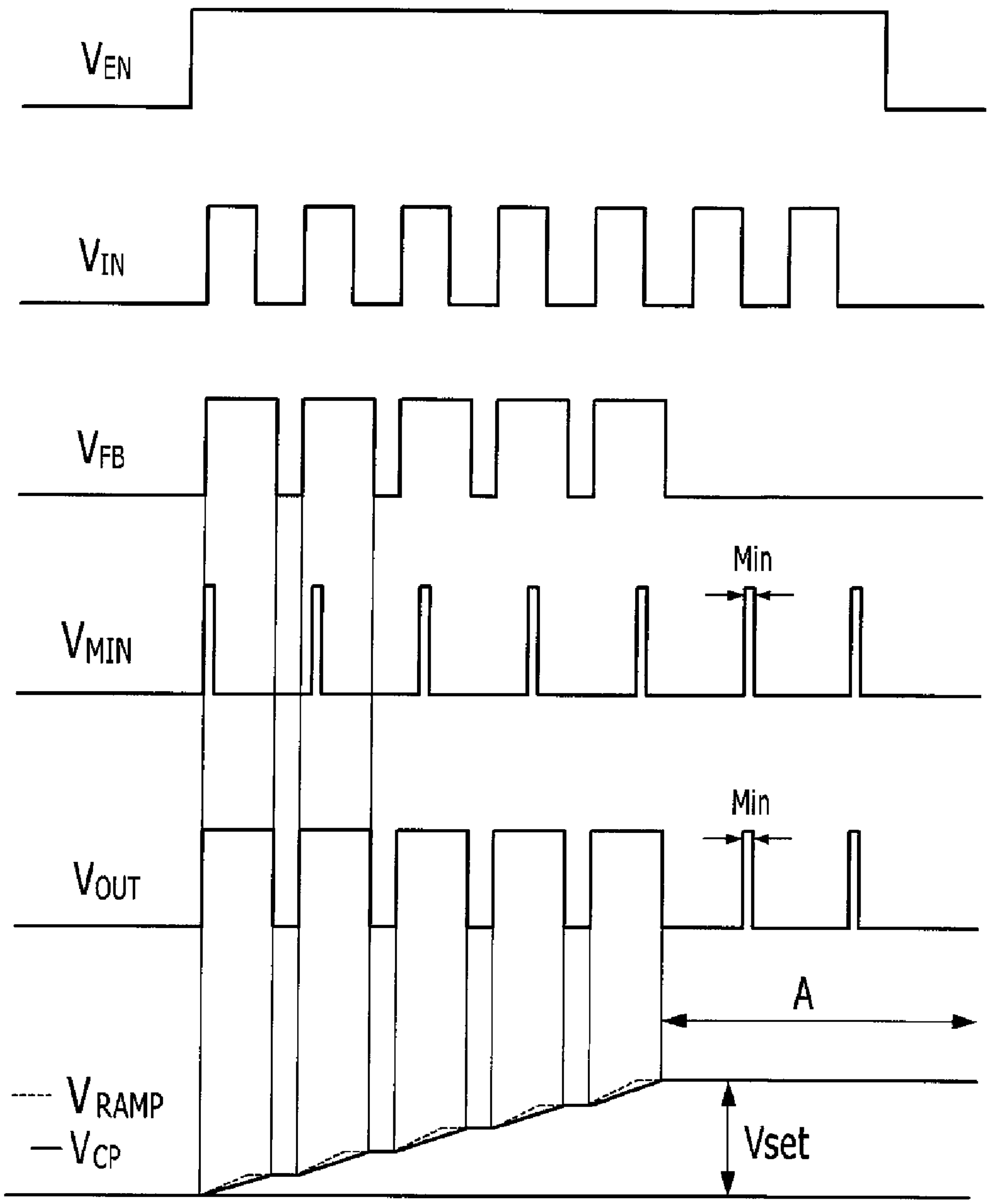
FIGS. 7 and 8 are operation timing diagrams of the ramp slope compensation circuit according to the second exemplary embodiment of the present invention.
Figure 8:
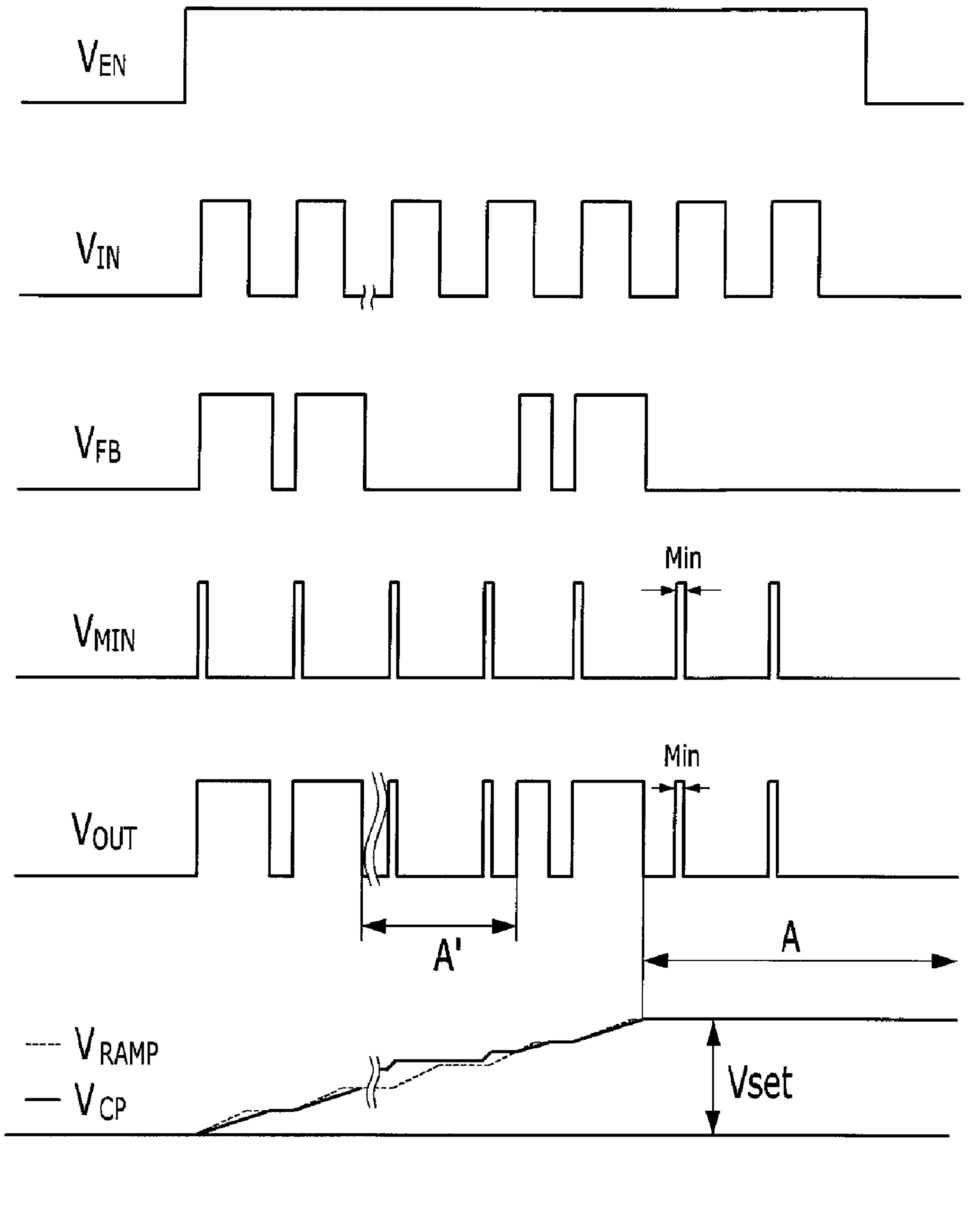

FIG. 6 is a diagram illustrating a ramp slope compensation circuit according to a second exemplary embodiment of the present invention, and FIGS. 7 and 8 are operation timing diagrams of the ramp slope compensation circuit according to the second exemplary embodiment of the present invention.

Referring to FIG. 6, the ramp slope compensation circuit 100*a* may further include a minimum pulse generator 160 and an OR element 170 in comparison with the ramp slope compensation circuit 100 according to the first exemplary embodiment of the present invention.

The minimum pulse generator 160 generates a minimum duty pulse signal $V_{MIN}$ having a minimum duty by using the input signal $V_{IN}$ in accordance with a minimum pulse set signal $V_{MINS}$. As one example, as shown in FIG. 7, the minimum pulse generator 160 may generate the minimum duty pulse signal $V_{MIN}$ which is triggered at a rising edge of the input signal $V_{IN}$ and has a predetermined duty Min. In this case, the duty Min may be set in the range of 0 to 50% with respect to an operation cycle of the input signal $V_{IN}$.

Referring to FIG. 7, the OR element 170 receives the minimum duty pulse signal $V_{MIN}$ and the pulse signal $V_{FB}$ of the comparator 130, and OR-computes two signals $V_{MIN}$ and $V_{FB}$ which are received and outputs it to the AND element 140. Since the OR element 170 outputs a signal of a low level during only a period when both the minimum duty pulse signal $V_{MIN}$ and the pulse signal $V_{FB}$ of the comparator 130 are in the low level, the driving control signal $V_{OUT}$ having the minimum duty may be outputted by the minimum duty pulse signal $V_{MIN}$ during the period A. In this case, since the duty of the minimum duty pulse signal $V_{MIN}$ is small, the voltage $V_{CP}$ of the Y electrode may not almost increase by the minimum duty pulse signal $V_{MIN}$.

Further, like a period A' of FIG. 8, when the voltage $V_{CP}$ of the Y electrode of the panel capacitor Cp is higher than the voltage of the reference waveform $V_{RAMP}$ while the ramp waveform rises, the pulse signal $V_{FB}$ of the low level may continuously be outputted. Even during such a period A', the frequency interference which is caused by the flexible frequency may occur. The ramp slope compensation circuit 100*a* according to the second exemplary embodiment of the present invention may output the driving control signal $V_{OUT}$ having the minimum duty during the period A' by using the minimum duty pulse signal $V_{MIN}$. As such, the ramp slope compensation circuit 100*a* may operate at a fixed frequency by the minimum duty pulse signal $V_{MIN}$ and may minimize the frequency interference which is caused by the flexible frequency.

Figure 9:
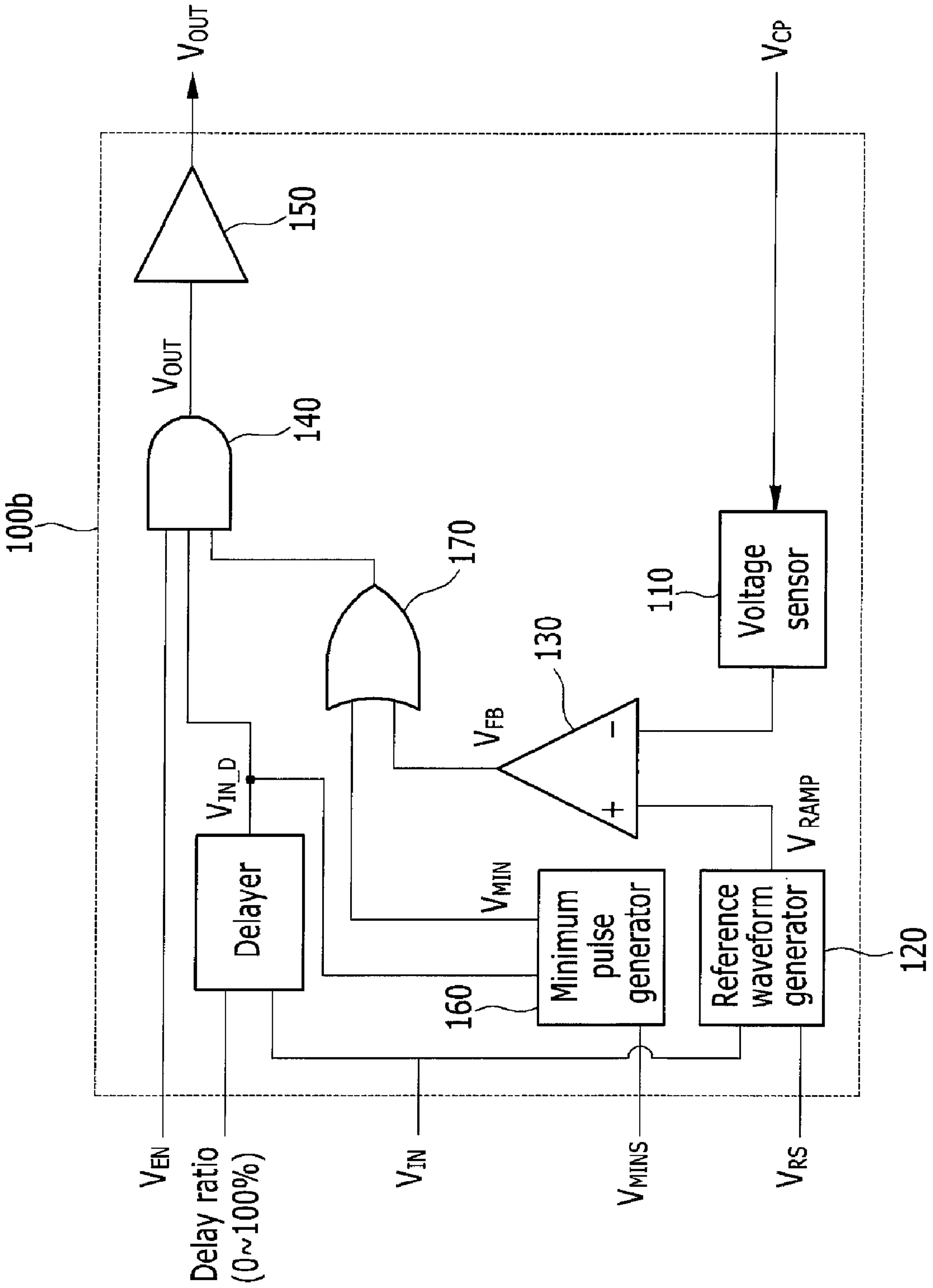
FIG. 9 is a diagram illustrating a ramp slope compensation circuit according to a third exemplary embodiment of the present invention.
Figure 10:
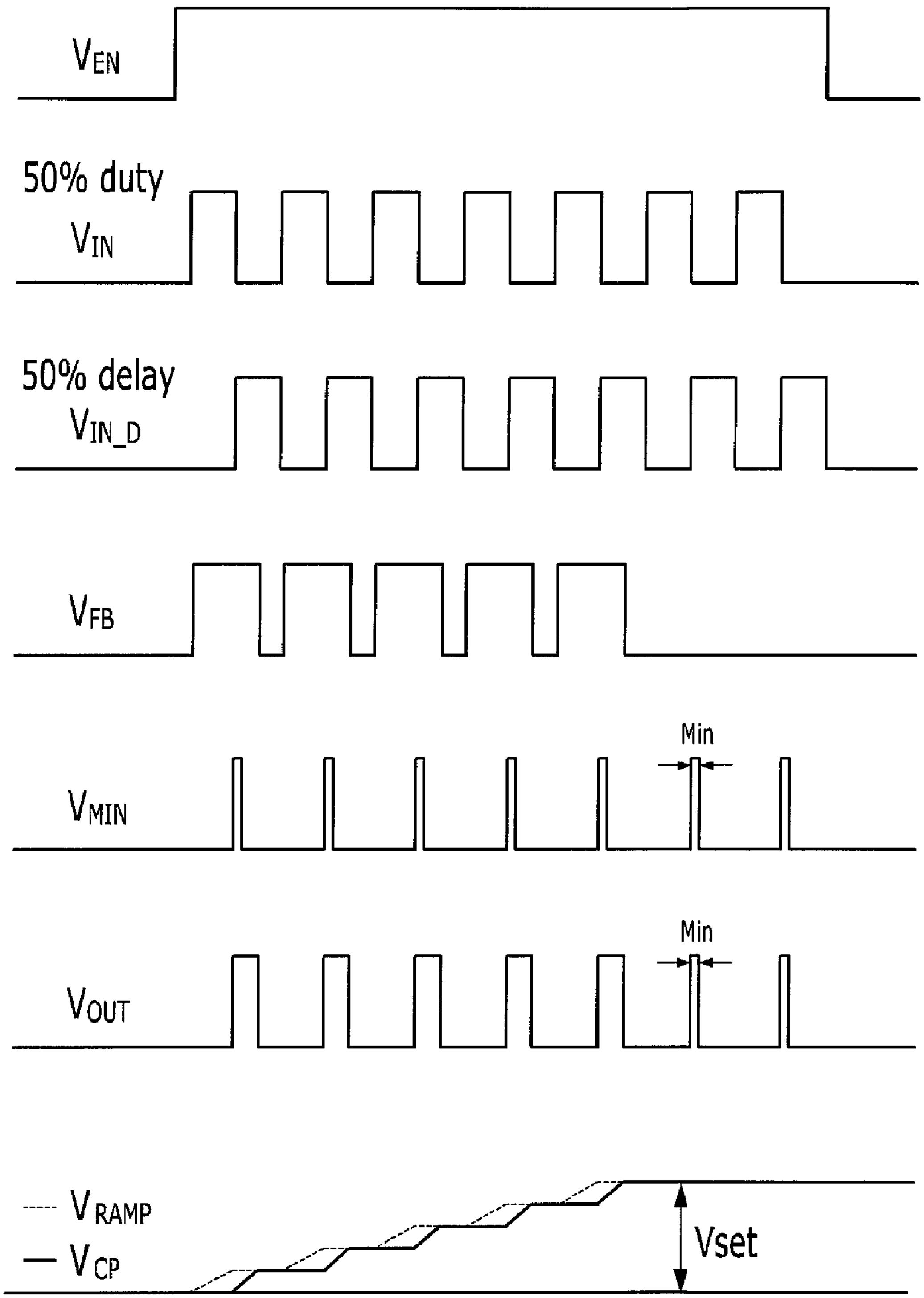
FIGS. 10 and 11 are operation timing diagrams of the ramp slope compensation circuit according to the third exemplary embodiment of the present invention.
Figure 11:
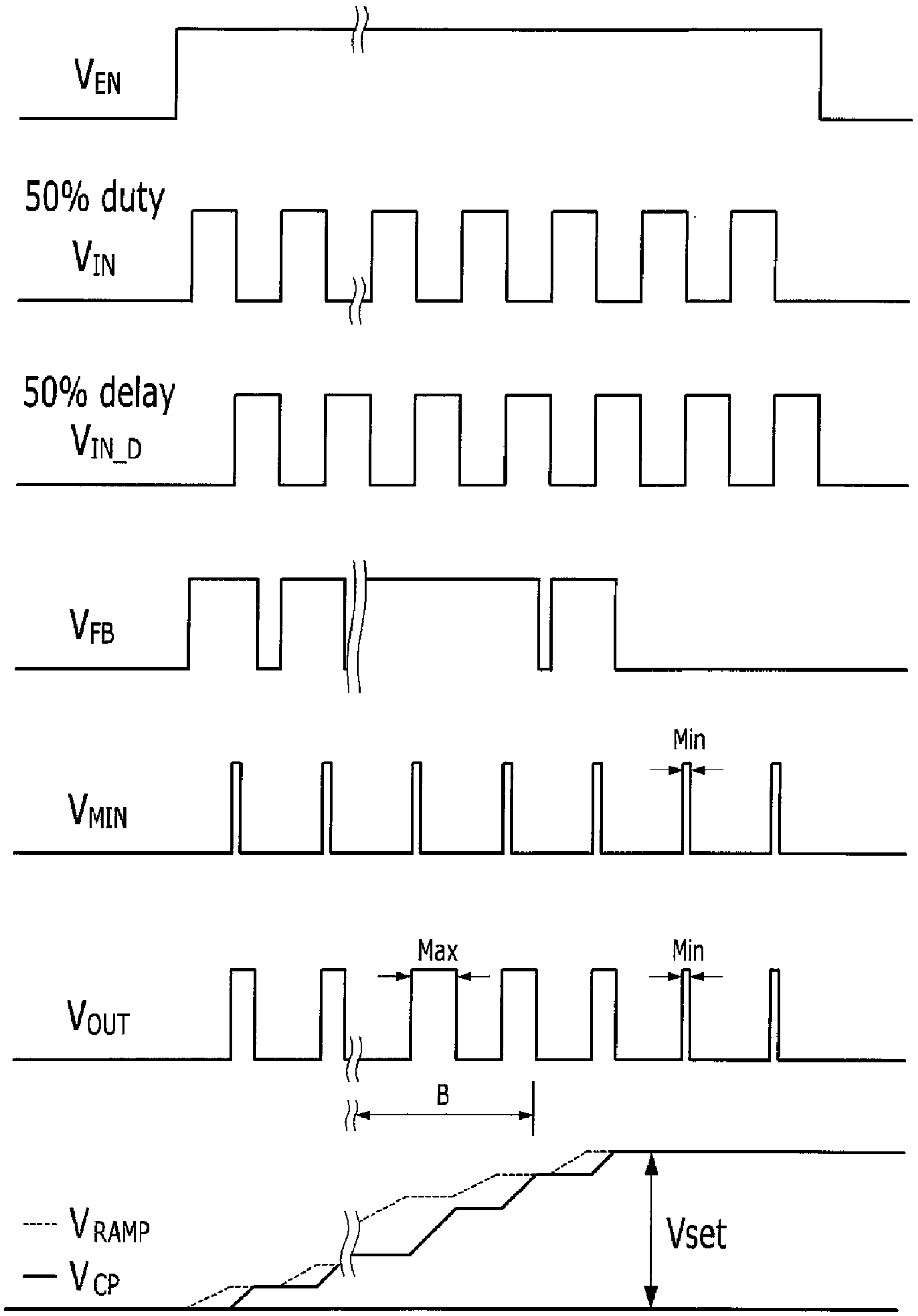

FIG. 9 is a diagram illustrating a ramp slope compensation circuit according to a third exemplary embodiment of the present invention, and FIGS. 10 and 11 are operation timing diagrams of the ramp slope compensation circuit according to the third exemplary embodiment of the present invention.

Referring to FIG. 9, the ramp slope compensation circuit 100*b* may further include a delayer 180 in comparison with the ramp slope compensation circuit 100 according to the first or second exemplary embodiment of the present invention. In FIG. 9, the ramp slope compensation circuit 100*b* formed by adding the delayer 180 to the ramp slope compensation circuit 100 according to the second exemplary embodiment of the present invention is shown.

The delayer 180 delays the input signal $V_{IN}$ by a predetermined delay ratio and outputs the delayed input signal $V_{IN\_D}$ to the AND element 140. In this case, the delay ratio is a value in the range of 0 to 100% of the input signal $V_{IN}$ and may be set outside of the delayer 180.

As one example, as shown in FIG. 10, the delayer 180 may delay the input signal $V_{IN}$ by a half cycle (50% delay) of the input signal $V_{IN}$. However, the present invention is not limited thereto.

Further, the minimum pulse generator 160 may generate the minimum duty pulse signal $V_{MIN}$ which is triggered at a rising edge of the delayed input signal $V_{IN\_D}$ and has a smaller duty than the delayed input signal $V_{IN\_D}$.

As such, in the case in which the delayer 180 is further included in the ramp slope compensation circuit 100*b*, an AND element 140*b* has three input terminals unlike the second exemplary embodiment, and the enable signal $V_{EN}$, the delayed input signal $V_{IN\_D}$, and an output signal $V_{OR}$ of the OR element 170 may be inputted into three input terminals of the AND element 140*b*.

Meanwhile, the ramp slope compensation circuit 100*b* may include an inverter element (not shown) which inverts and outputs the input signal VIN instead of the delayer 180. Therefore, the minimum pulse generator 160 may generate the minimum duty pulse signal VMIN which is triggered at a rising edge of the inverted input signal generated from the inverter element. The AND element 140*b* outputs the driving control signal $V_{OUT}$ of the high level during a period when all of the signals $V_{EN}$, $V_{IN\_D}$, and $V_{OR}$ which are inputted into three input terminals are in the high level. Therefore, the driving control signal $V_{OUT}$ may be represented as shown in FIG. 10.

As such, the ramp slope compensation circuit 100*b* also generates the driving control signal $V_{OUT}$ by using the delayed input signal $V_{IN\_D}$ and the pulse signal $V_{FB}$ resulting from the comparison of the voltage of the reference waveform $V_{RAMP}$ generated by the input signal $V_{IN}$ and the voltage $V_{CP}$ of the Y electrode.

The maximum duty of the driving control signal $V_{OUT}$ according to the third exemplary embodiment of the present invention is limited by the delayed input signal $V_{IN\_D}$. That is, in the case in which the maximum duty is not limited, the driving control signal $V_{OUT}$ is maintained as the high level during a period B in FIG. 11. Therefore, the transistor Yset is maintained as a turn-on state during the period B. This may cause the transistor Yset to be damaged or broken.

Accordingly, in the third exemplary embodiment of the present invention, the delayed input signal $V_{IN\_D}$ or an inversion signal of the input signal for controlling the maximum duty of the driving control signal $V_{OUT}$ is used. However, by the limitation of the maximum duty of the driving control signal $V_{OUT}$, the voltage $V_{CP}$ of the Y electrode may not follow up the reference waveform $V_{RAMP}$ like the period B of FIG. 11.

Hereinafter, an embodiment for solving a problem which may occur due to the limitation of the maximum duty of the driving control signal $V_{OUT}$ will be described with reference to FIG. 12.

Figure 12:
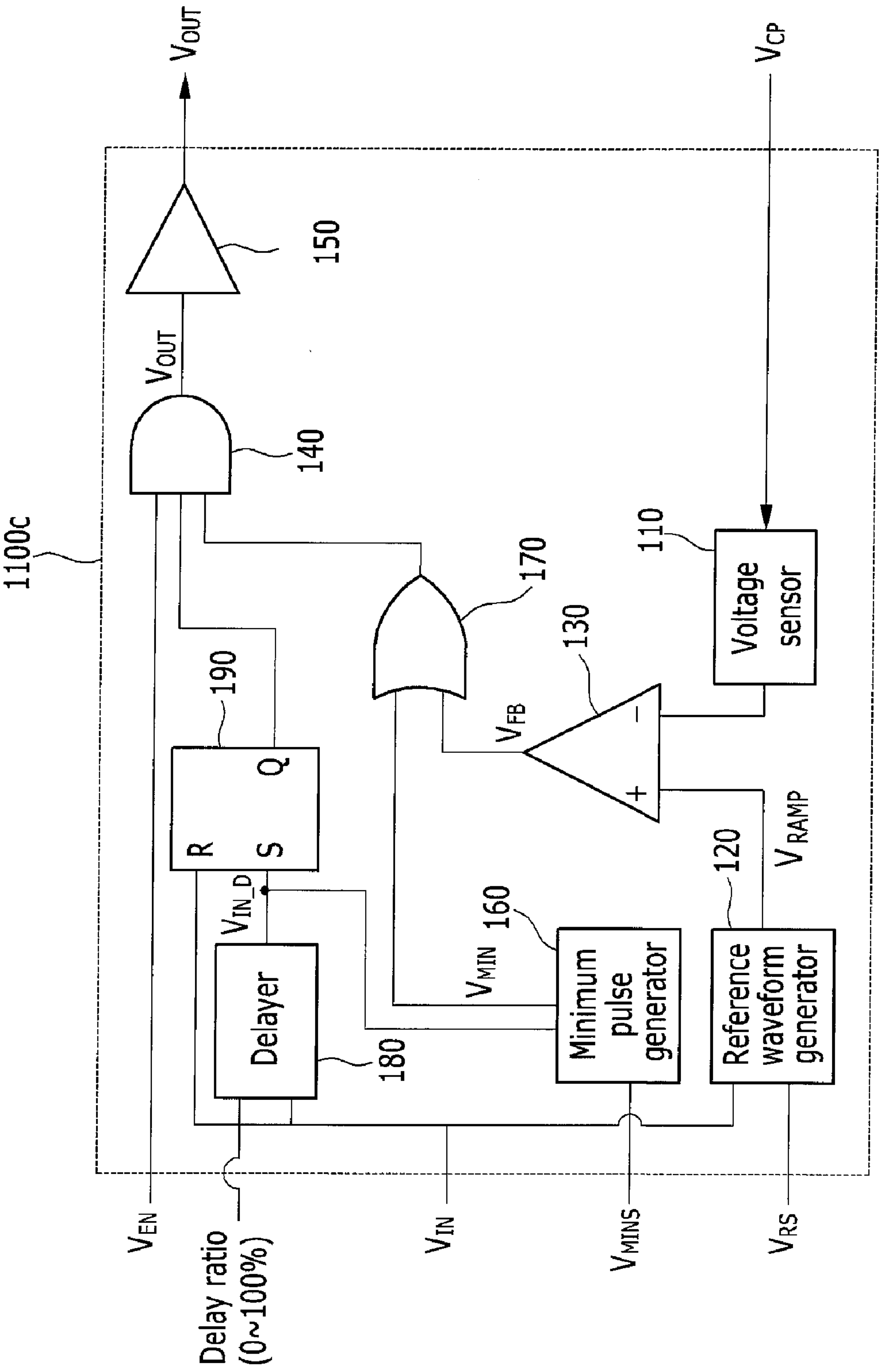
FIG. 12 is a diagram illustrating a ramp slope compensation circuit according to a fourth exemplary embodiment of the present invention.

FIG. 12 is a diagram illustrating a ramp slope compensation circuit according to a fourth exemplary embodiment of the present invention.

Referring to FIG. 12, the ramp slope compensation circuit 100*c* may further include a flip-flop element, i.e., an SR latch 190 in comparison with the ramp slope compensation circuit 100*b* according to the third exemplary embodiment of the present invention. The flip-flop element may be connected between an output terminal of the delayer 180 and the AND element 140.

The SR latch 190 includes a reset terminal R into which the input signal $V_{IN}$ is inputted, a set terminal S into which the delayed input signal $V_{IN\_D}$ of the delayer 180 is inputted, and an output terminal Q connected to the AND element 140. The SR latch 190 outputs the high level in synchronized with a rising edge of the delayed input signal $V_{IN\_D}$ inputted into the set terminal S and outputs the low level in synchronization with a rising edge of the input signal $V_{IN}$ inputted into the reset terminal R.

That is, the SR latch 190 generates an output signal of the high level by latching the delayed input signal $V_{IN\_D}$ of the high level and resets the output signal to the low level in synchronization with a rising time of the input signal $V_{IN}$.

That is, in the third exemplary embodiment, in the case in which the duty of the input signal $V_{IN}$ is 30%, when the driving control signal $V_{OUT}$ is generated in accordance with the delayed input signal $V_{IN\_D}$, the duty of the driving control signal $V_{OUT}$ cannot be higher than 30% even in the case in which the voltage $V_{CP}$ of the Y electrode cannot follow up the reference waveform $V_{RAMP}$. However, according to the fourth exemplary embodiment, since the driving control signal $V_{OUT}$ is generated on the basis of the output signal of the SR latch 190, the maximum duty of the driving control signal $V_{OUT}$ may be extend from the rising time of the delayed input signal $V_{IN\_D}$ to the next rising time of the input signal $V_{IN}$. As a result, the voltage $V_{CP}$ of the Y electrode can rapidly follow up the reference waveform $V_{RAMP}$.

Like this, according to the fourth exemplary embodiment of the present invention, the period from the rising time of the delayed input signal $V_{IN\_D}$ to the next rising time of the input signal $V_{IN}$ is the maximum duty of the driving control signal $V_{OUT}$. Therefore, it is possible to set the maximum duty limit regardless of the duty of the input signal $V_{IN}$.

Further, as described in the fourth exemplary embodiment of the present invention, by using the SR latch 190, it is possible to increase the noise immunity of the input signal $V_{IN}$ and prevent a glitch phenomenon of the driving controls signal $V_{OUT}$.

In the case in which the duty of the input signal $V_{IN}$ is high, a pre-input signal $V_{IN\_D}$ acquired by delaying an input signal $V_{IN}$ of a pre-cycle may be overlapped with an input signal $V_{IN}$ of a current cycle. That is, a high level of the delayed pre-cycle input signal $V_{IN\_D}$ and a high level of the current input signal $V_{IN}$ may be overlapped with each other.

Therefore, the reference waveform $V_{RAMP}$ starts to increase at the rising time of the input signal $V_{IN}$, such that it becomes larger than the voltage $V_{CP}$ of the Y electrode again and the pulse signal $V_{FB}$ is in the high level again. As a result, the driving control signal $V_{OUT}$ may be in the high level again. This oscillates the driving control signal $V_{OUT}$, thereby causing a malfunction and high-frequency noise of the circuit.

Since the signal of the low level is outputted in synchronization with the rising time of the input signal $V_{IN}$ which is inputted into the reset terminal R of the SR latch 190, the driving control signal is not in the high level again even though feedback voltage is in the high level again.

Like this, by using the SR latch, it is possible to control the maximum duty in which the voltage $V_{CP}$ of the Y electrode rapidly can follow up the reference waveform $V_{RAMP}$ within a tolerance limit regardless of a case in which the duty of the pulse signal $V_{FB}$ is low or high. "Within the tolerance limit" means a voltage of the Y electrode which is maintained as dark discharge.

Like this, the ramp waveform generating apparatus 10 according to the exemplary embodiment of the present invention may generate a stable ramp waveform regardless of internal and external factors without using a complicated feedback algorithm or an element such as an ADC or a DAC. Further, it is possible to control even the slope of a rising ramp waveform and a voltage variation width of one step in the rising ramp waveform without a bootstrap capacitor.

Figure 13A:
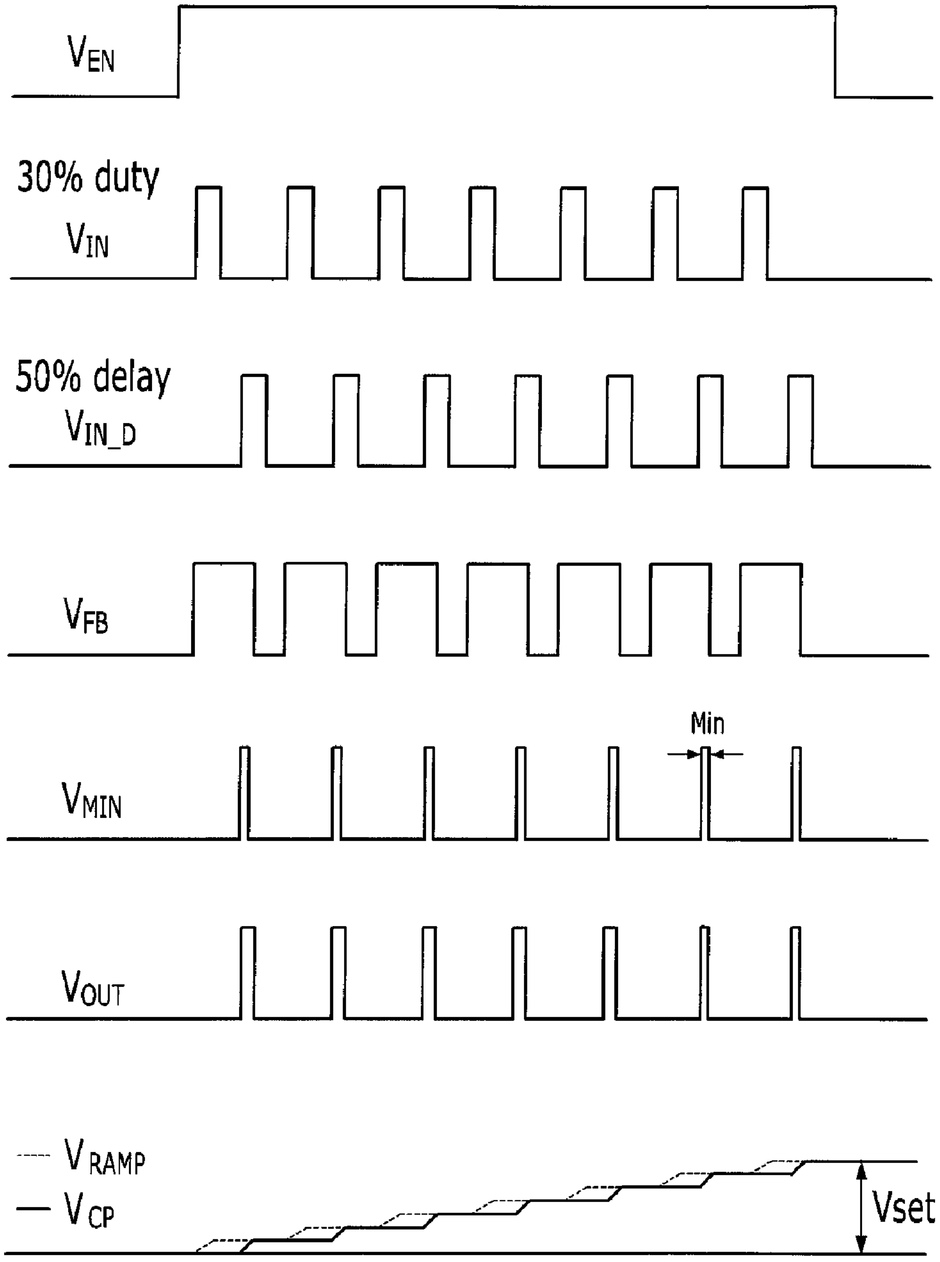
FIGS. 13A to 13C are diagrams illustrating a driving control signal depending on an input signal having duties of 30%, 50%, and 70%.
Figure 13B:
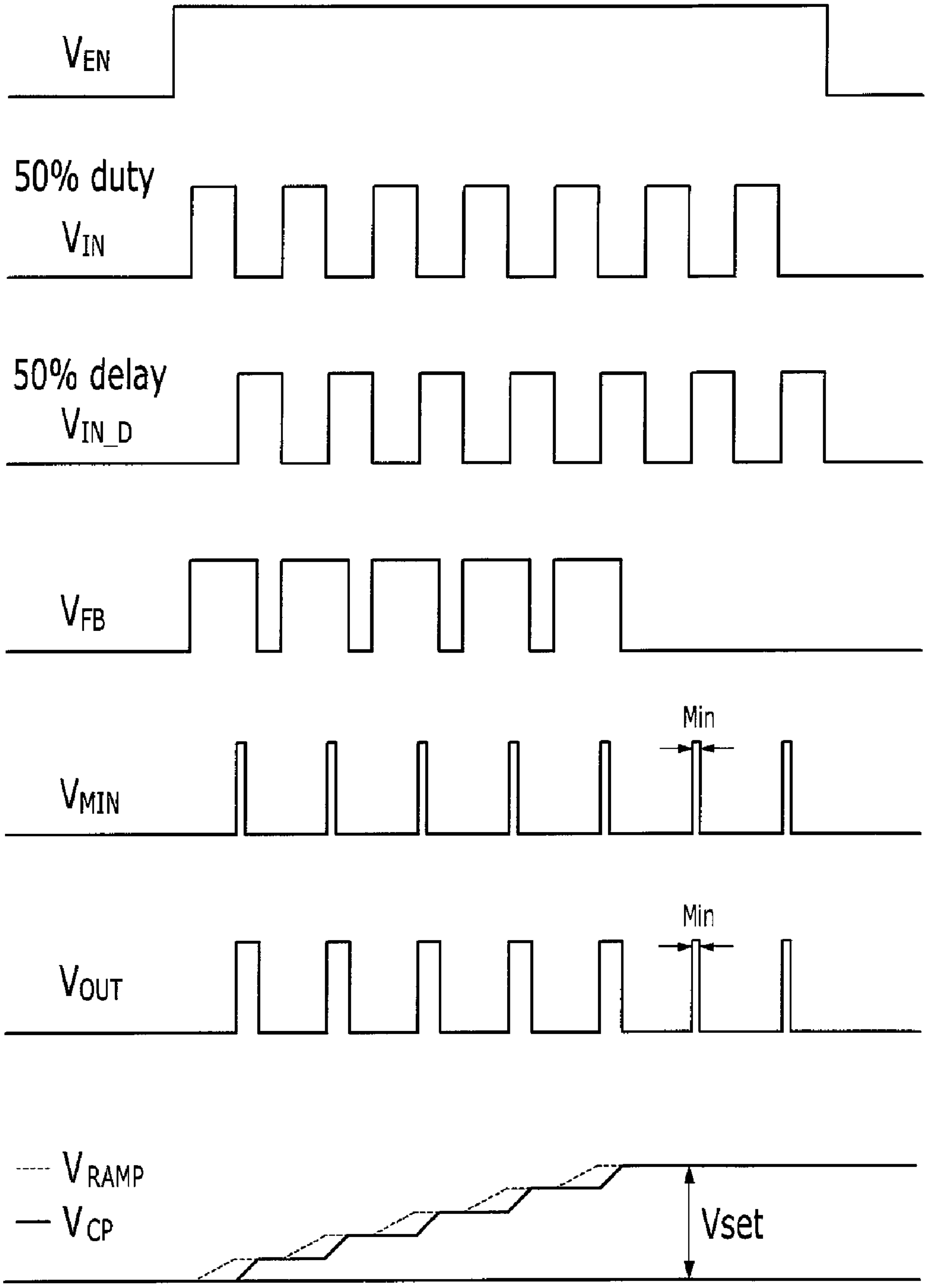
Figure 13C:
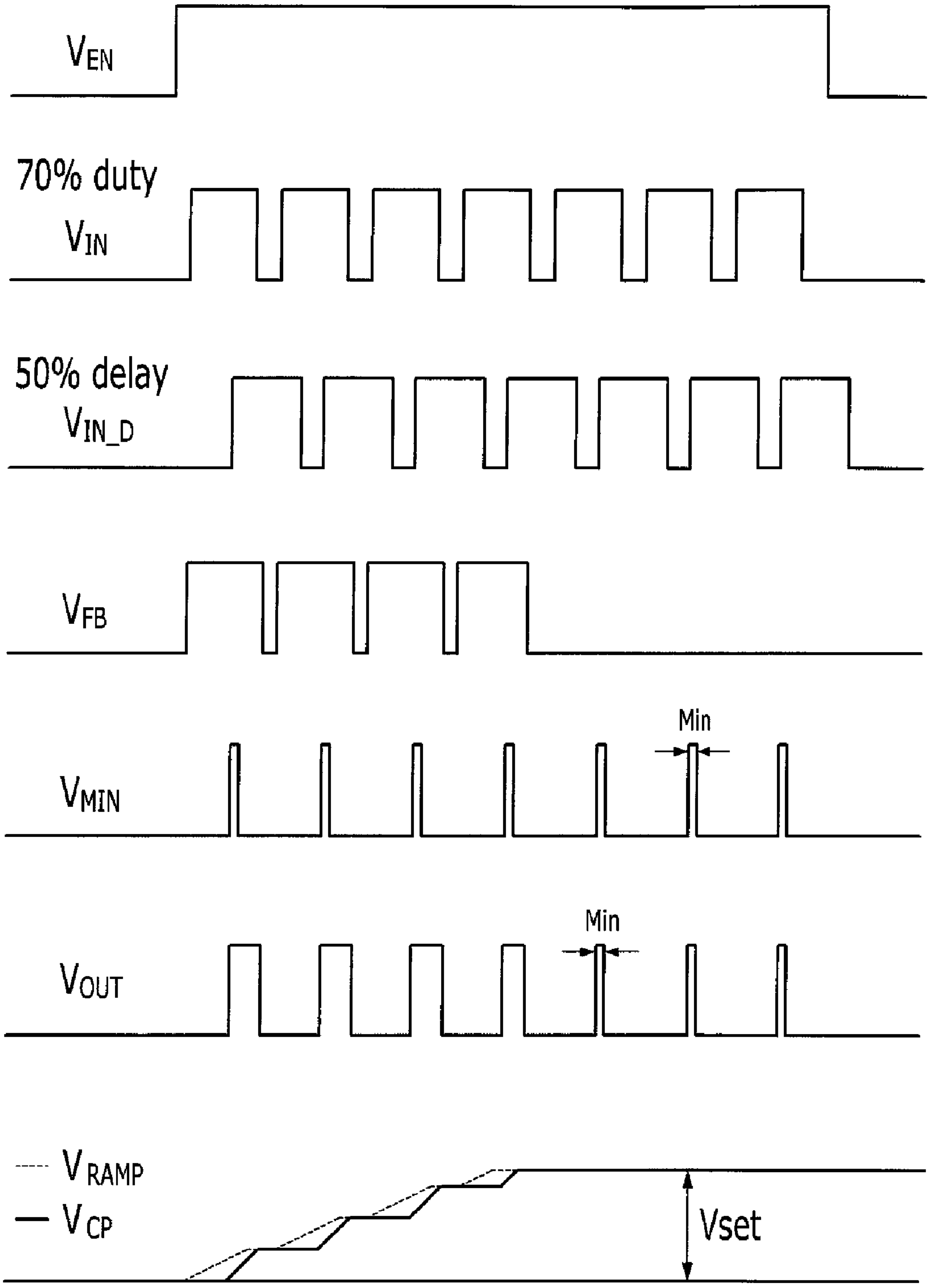

FIGS. 13A to 13C are diagrams illustrating a driving control signal depending on an input signal having duties of 30%, 50%, and 70%.

Referring to FIGS. 13A to 13C, even though the slope of the reference waveform $V_{RAMP}$ is changed by changing the duties (30%, 50%, and 70%) of the input signal $V_{IN}$, the voltage $V_{CP}$ of the Y electrode can well follow up the reference waveform $V_{RAMP}$.

Figure 14A:
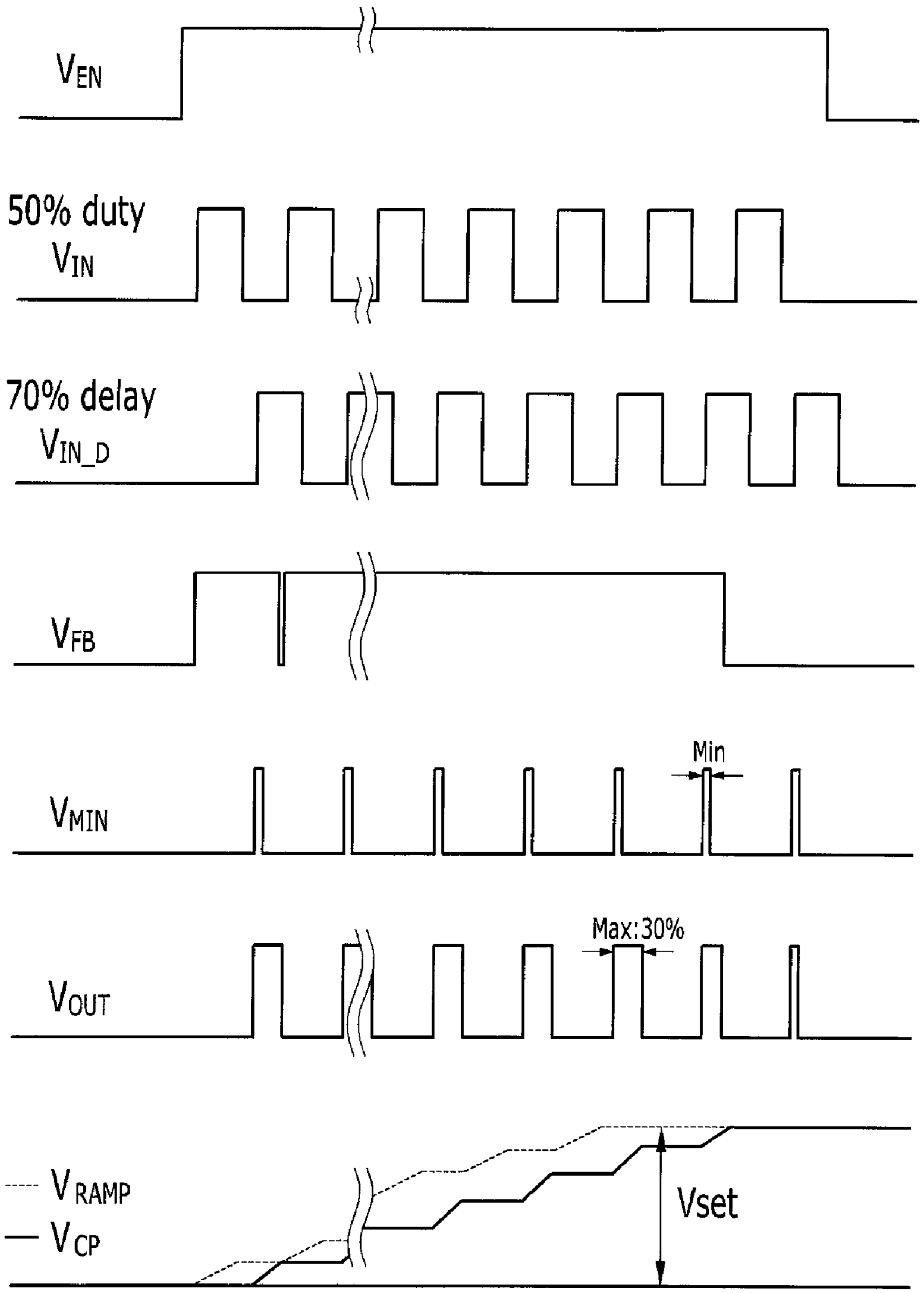
FIGS. 14A and 14B are diagrams illustrating a driving control signal depending on a delayed input signal having delay ratios of 30% and 70%.
Figure 14B:
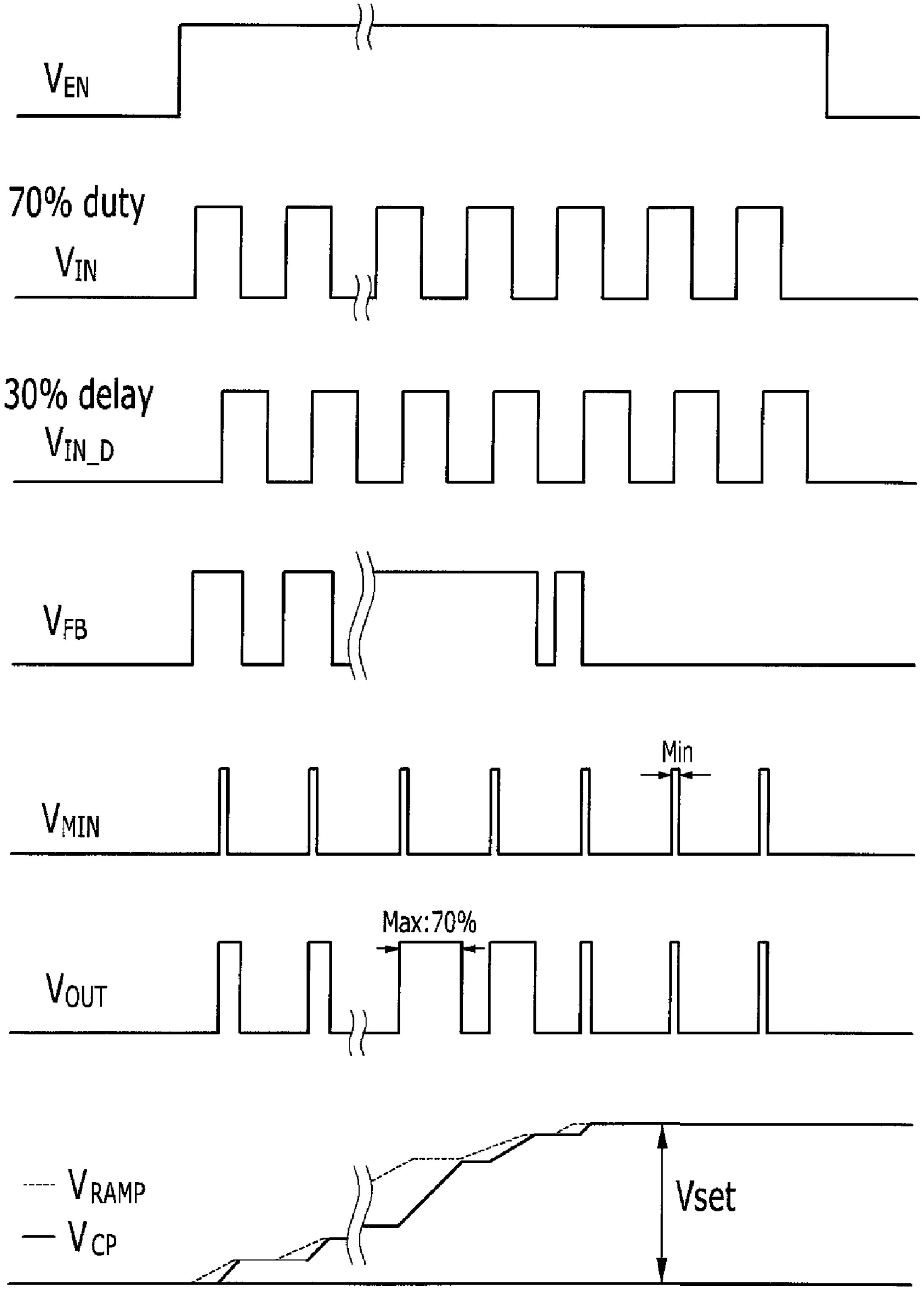

FIGS. 14A and 14B are diagrams illustrating a driving control signal depending on a delayed input signal having delay ratios of 30% and 70%.

Referring to FIGS. 14A and 14B, in the case in which the voltage $V_{CP}$ of the Y electrode cannot follow up the reference waveform $V_{RAMP}$ by the internal or external factor, a period when the driving control signal $V_{OUT}$ is in the high level during the period B increases to the maximum duty limit. That is, the ramp waveform generating apparatus 10 according to the exemplary embodiment of the present invention allows the voltage $V_{CP}$ of the Y electrode to rapidly follow up the reference waveform $V_{RAMP}$ by increasing the period when the driving control signal $V_{OUT}$ is in the high level when the voltage $V_{CP}$ of the Y electrode cannot follow up the reference waveform $V_{RAMP}$ and can also limit the voltage variation width of one step of the voltage $V_{CP}$ of the Y electrode by limiting the maximum duty.

According to the exemplary embodiments of the present invention, it is possible to generate a stable ramp waveform regardless of internal and external factors without using a complicated feedback algorithm or an element such as an ADC or a DAC. Further, it is possible to simply control even the slope of the ramp waveform and a voltage variation width of one step in the ramp waveform without a bootstrap capacitor.

Although in the apparatus and/or the method described above, the rising ramp waveform applied during the reset period of the plasma display device has been described through the exemplary embodiments, the apparatus and/or the method can be applied to even the falling ramp waveform. Further, the above-mentioned apparatus and/or method can also be applied to another device requiring a waveform in which the voltage of a load rises and/or falls at a predetermined slope in addition to the plasma display device.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. An apparatus for generating a ramp waveform, which controls a switch having a first terminal connected to a load and a second terminal connected to a power supply, comprising:

a gate driver connected to a control terminal of the switch and changing a voltage of the load to a ramp form by outputting a driving control signal for controlling on and off operations of the switch to the control terminal of the switch; and a ramp slope compensation circuit receiving an input signal having a predetermined duty, sensing the voltage of the load, generating a reference waveform using the input signal, and controlling the driving control signal by using the voltage of the load and the reference waveform.

2. The apparatus of claim 1, wherein:

the ramp slope compensation circuit includes, a voltage sensor sensing the voltage of the load, a reference waveform generator generating the reference waveform by using the input signal, and a comparator outputting a pulse signal corresponding to the driving control signal by comparing a voltage of the reference waveform with the voltage of the load.

3. The apparatus of claim 2, wherein:

the ramp slope compensation circuit further includes, a logic element generating the driving control signal by logic-computing an enable signal having a predetermined level during an operation period of the ramp slope compensation circuit and the pulse signal.

4. The apparatus of claim 2, wherein:

the reference waveform includes a stepped ramp waveform in which voltage is changed in a first level of the input signal and the voltage is maintained in a second level of the input signal.

5. The apparatus of claim 2, wherein:

the ramp slope compensation circuit further includes, a minimum duty pulse generator generating a minimum duty pulse signal having a predetermined duty which is 50% less than a cycle of the input signal in synchronization with the input signal, and a logic element generating the driving control signal by logic-computing the minimum duty pulse signal and the pulse signal.

6. The apparatus of claim 5, wherein:

the logic element includes, an OR element OR-computing the minimum duty pulse signal and the pulse signal, and an AND element AND-computing an output signal of the OR element and an enable signal having a predetermined level during an operation period of the ramp slope compensation circuit.

7. The apparatus of claim 5, wherein:

the ramp slope compensation circuit further includes, a delayer delaying the input signal by a predetermined delay ratio of one cycle of the input signal and outputting the delayed input signal to the logic element.

8. The apparatus of claim 7, wherein:

the delay ratio is adjusted from outside of the delayer.

9. The apparatus of claim 7, wherein:

the minimum duty pulse generator generates the minimum duty pulse signal having a predetermined duty which is 50% less than a cycle of the input signal in synchronization with the delayed input signal transferred from the delayer.

10. The apparatus of claim 9, wherein:

the logic element includes, an OR element OR-computing the minimum duty pulse signal and the pulse signal, and an AND element AND-computing an output signal of the OR element, an enable signal having a predetermined level during an operation period of the ramp slope compensation circuit, and the delayed input signal of the delayer.

11. The apparatus of claim 7, wherein:

the ramp slope compensation circuit further includes, a flip-flop element generating an output signal by latching the duty of delayed input signal and resetting the output signal at the next cycle starting time of the input signal.

12. The apparatus of claim 11, wherein:

the logic element includes, an OR element OR-computing the minimum duty pulse signal and the pulse signal, and an AND element AND-computing an output signal of the OR element, an enable signal having a predetermined level during an operation period of the ramp slope compensation circuit, and the output signal of the flip-flop element.

13. The apparatus of claim 5, wherein:

the ramp slope compensation circuit further includes, an inverter element inverting the input signal and outputting the inverted input signal to the logic element.

14. The apparatus of claim 13, wherein:

the minimum duty pulse generator generates the minimum duty pulse signal having a predetermined duty which is 50% less than a cycle of the input signal by using the inverted input signal transferred from the inverter element.

15. The apparatus of claim 14, wherein:

the logic element includes, an OR element OR-computing the minimum duty pulse signal and the pulse signal, and an AND element AND-computing an output signal of the OR element, an enable signal having a predetermined level during an operation period of the ramp slope compensation circuit, and the output signal of the inverter.

16. The apparatus of claim 2, wherein:

the ramp slope compensation circuit further includes, a buffer amplifying the driving control signal and thereafter, outputting the amplified driving control signal to the gate driver.

17. A method for generating a ramp waveform by controlling a switch having a first terminal connected to a load and a second terminal connected to a power supply in a ramp waveform generating apparatus, comprising:

receiving an input signal having a predetermined duty;

sensing a voltage of the load;

generating a reference waveform by using the input signal;

generating a driving control signal by comparing the voltage of the load with the voltage of the reference waveform; and generating the ramp waveform by turning on and off the switch in accordance with the driving control signal.

18. The method of claim 17, wherein:

the generating of the driving control signal includes, outputting a pulse signal by comparing the voltage of the load with the voltage of the reference waveform, and generating the driving control signal by logic-computing an enable signal having a predetermined level during an operation period of the ramp waveform generating apparatus and the pulse signal.

19. The method of claim 18, wherein:

the generating of the driving control signal further includes, delaying the input signal, and the generating of the driving control signal by the logic computation includes, additionally logic-computing the delayed input signal in addition to the enable signal and the pulse signal.

20. The method of claim 19, wherein:

the generating of the driving control signal further includes, generating an output signal by latching a duty of the delayed input signal, and resetting the output signal at the next cycle start time of the input signal, and the generating of the driving control signal by the logic computation includes, additionally logic-computing the output signal in addition to the enable signal and the pulse signal.

21. The method of claim 17, wherein:

the generating of the driving control signal includes, generating a minimum duty pulse signal having a predetermined duty which is 50% less than a cycle of the input signal in synchronization with the input signal, outputting a pulse signal by comparing a voltage of the load with a voltage of the reference waveform, and generating the driving control signal by logic-computing the pulse signal with the minimum duty pulse signal.

22. The method of claim 21, wherein:

the generating of the driving control signal by the logic computation includes,

OR-computing the minimum duty pulse signal and the pulse signal, and

AND-computing the OR-computed signal and an enable signal having a predetermined level during an operation period of the ramp waveform generating apparatus.

23. The method of claim 22, wherein:

the generating of the driving control signal further includes, delaying the input signal, the generating of the minimum duty pulse signal, generates the minimum duty pulse signal having a predetermined duty which is 50% less than a cycle of the input signal in synchronization with the delayed input signal instead of the input signal, and the AND-computing includes, additionally AND-computing the delayed input signal in addition to the OR-computed signal and the enable signal.

24. The method of claim 22, wherein:

the generating of the driving control signal includes, delaying the input signal, generating an output signal by latching a duty of the delayed input signal, and resetting the output signal at the next cycle start time of the input signal, the generating of the minimum duty pulse signal, generates the minimum duty pulse signal having a predetermined duty which is 50% less than a cycle of the input signal in synchronization with the output signal instead of the input signal, the AND-computing includes, additionally logic-computing the output signal in addition to the enable signal and the pulse signal.

* * * * *